United States Patent [19]

Ooya

[11] Patent Number: 5,672,386
[45] Date of Patent: Sep. 30, 1997

[54] PROCESS FOR FORMING A COATING OF CHROMIUM AND NITROGEN HAVING GOOD WEAR RESISTANCE PROPERTIES

[75] Inventor: Masaki Ooya, Kashiwazaki, Japan

[73] Assignee: Kabushiki Kaisha Riken, Tokyo, Japan

[21] Appl. No.: 625,061

[22] Filed: Mar. 29, 1996

Related U.S. Application Data

[62] Division of Ser. No. 327,896, Oct. 27, 1994, Pat. No. 5,587,227.

[51] Int. Cl.$^6$ .................................... C23C 16/34
[52] U.S. Cl. ................ 427/250; 427/255.2; 427/255.7
[58] Field of Search ........................ 427/248.1, 250, 427/255.2, 255.7, 530, 528, 590

[56] References Cited

U.S. PATENT DOCUMENTS

| | | | |
|---|---|---|---|
| Re. 34,173 | 2/1993 | Kerber | 428/610 |
| 4,428,811 | 1/1984 | Sproul et al. | 204/192 |
| 4,919,773 | 4/1990 | Naik | 204/38.4 |
| 4,943,486 | 7/1990 | Uchiyama | 428/469 |
| 5,160,537 | 11/1992 | Terrat et al. | 106/36 |

FOREIGN PATENT DOCUMENTS

| | | |
|---|---|---|
| 62-120471 A | 6/1987 | Japan . |
| 1-52471 B | 11/1989 | Japan . |
| 6-10454 B | 2/1994 | Japan . |
| 6-322515 A | 11/1994 | Japan . |
| 7167300 | 7/1995 | Japan . |
| 2158104 | 11/1985 | United Kingdom . |
| 2178064 | 2/1987 | United Kingdom . |
| 2243162 | 10/1991 | United Kingdom . |

*Primary Examiner*—Shrive Beck
*Assistant Examiner*—Timothy Meeks
*Attorney, Agent, or Firm*—Kubovcik & Kubovcik

[57] ABSTRACT

A coating containing chromium and nitrogen is formed on the surface of a substrate. The chromium concentration of the coating is continuously and gradually increased from the substrate surface in a perpendicular direction toward the surface of the coating. A coating having good wear resistance and initial conformability is obtained.

1 Claim, 5 Drawing Sheets

1

PROCESS FOR FORMING A COATING OF CHROMIUM AND NITROGEN HAVING GOOD WEAR RESISTANCE PROPERTIES

This is a division of application Ser. No. 08/327,896, filed Oct. 27, 1994, now U.S. Pat. No. 5,587,227.

BACKGROUND OF THE INVENTION

1. Field of the Invention

This invention relates to a coating having good wear resistance, good processing and good initial conformability produced on a surface of a sliding substrate in a sliding part such as a piston ring.

As a typical coating treatment which is performed to obtain wear resistance required for a sliding part such as a piston ring to be used in an internal combustion engine, there is a hard chromium-plating treatment. However, due to high output power, high capacity and exhaust gas regulation requirements for an internal combustion engine, the properties required for a piston ring have become more severe and it is difficult to obtain satisfactory heat, wear and sticking resistance properties with the chromium-plating process of the prior art.

Surface treatments such as composite plating and flame spraying processes have been proposed to improve these problems. Recently, an ion-plating coating has been developed and is applied to an outer sliding surface such as that of a piston ring. A piston ring, in which a coating of chromium nitride is produced by reacting nitrogen and chromium in the vapor phase, has remarkably useful cost and wear resistance and sticking resistance properties. However, this coating is a ceramic coating and if the difference in hardness with respect to the material of a cylinder in which the piston ring is used is large, then a phenomenon in which production of blow-by gas becomes great, results from damage to the cylinder during aging at initial operation. As mentioned, wear of the ring itself is less. However, since wear of a cylinder occurs in some cases, it is said that a ring having satisfactory properties cannot be obtained. Accordingly, a soft coating such as a tin-plating or a composite plating such as Cr—N and Ti—N has been provided on the outermost surface of a ceramic coating. However, there are problems such as cost and poor adherence properties.

To solve the above-mentioned problems, an object of this invention is to provide a coating for a surface of a sliding part, the coating having satisfactory wear resistance and initial conformability and which is useful for a sliding part such as a piston ring. The coating enables such parts to be used under severe conditions in an internal combustion engine, in which a heating load is increased because of regulation of exhaust gas and high output power.

SUMMARY OF THE INVENTION

To achieve the above-mentioned object and other objects, the present invention provides a coating having good wear resistance, initial conformability and good processing properties. The coating, which is produced on the surface of a sliding substrate such as a piston ring, comprises chromium and nitrogen, in which the concentration of chromium in the coating is continuously increased from the surface of the substrate to the surface of the coating in a direction perpendicular to the surface of the substrate.

In another embodiment, a layer of chromium is first formed on the surface of a sliding substrate and then a chromium nitride layer is formed in which the content, or concentration, of chromium increases in the direction of the outer surface of the layer.

BRIEF DESCRIPTION OF THE DRAWINGS

An ion-plating apparatus used to form a coating according to this invention is roughly shown in FIG. 1.

A section of the coating used in the line analysis in the examples and obtained in this invention is shown in FIG. 2.

Figure 2:
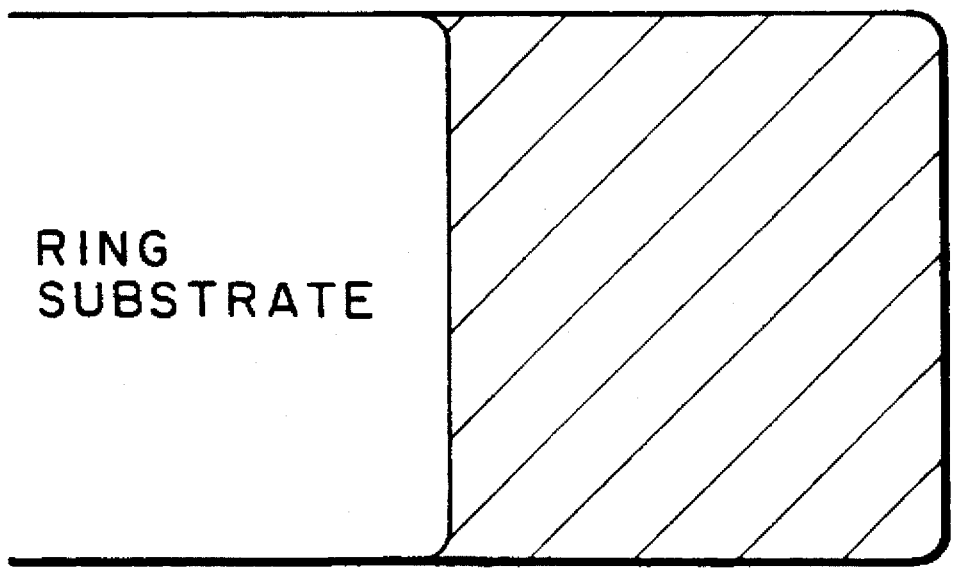
Figure 3:
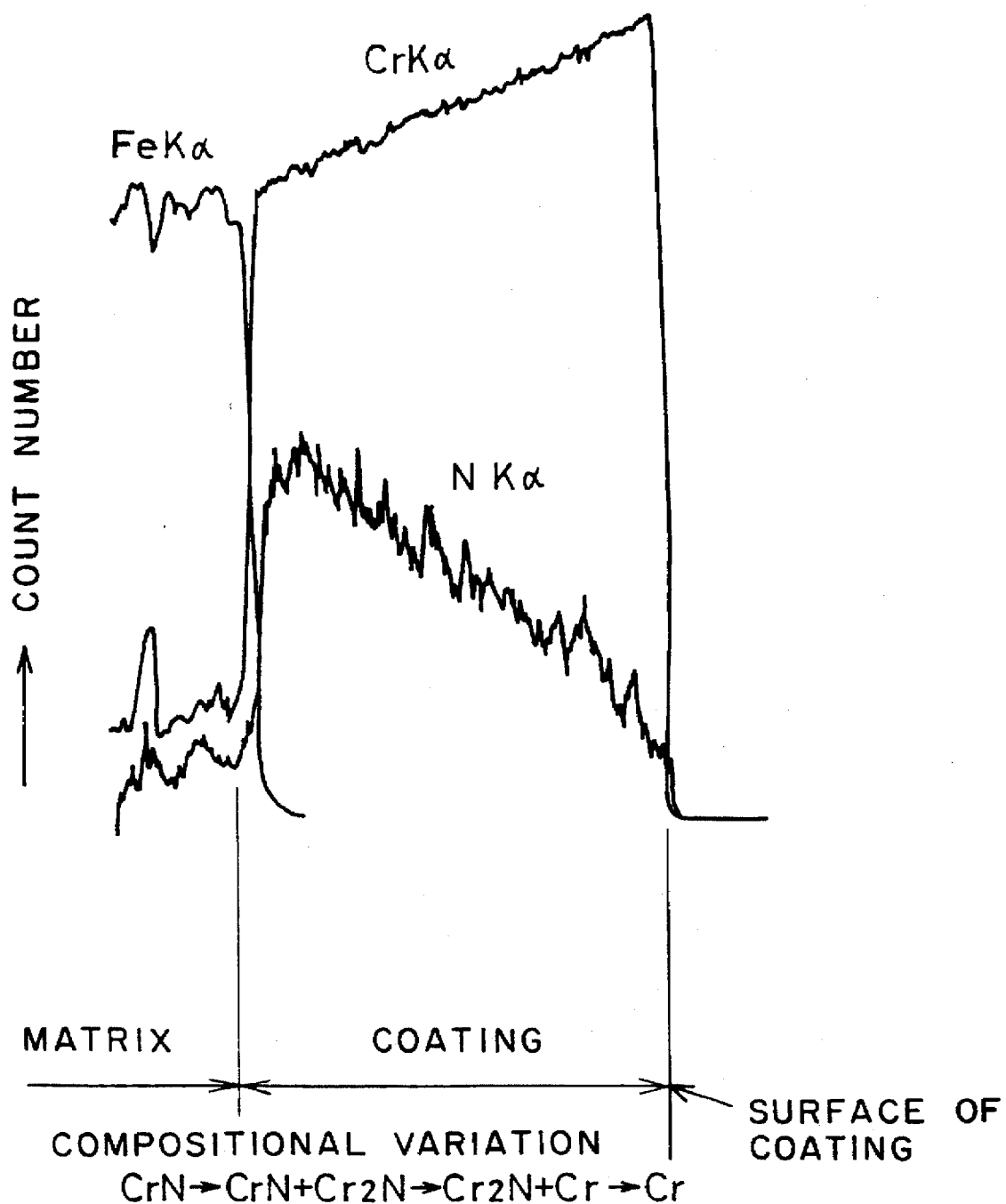

The results of the line analysis of the coating in FIG. 2 are shown in FIG. 3.

Figure 4:
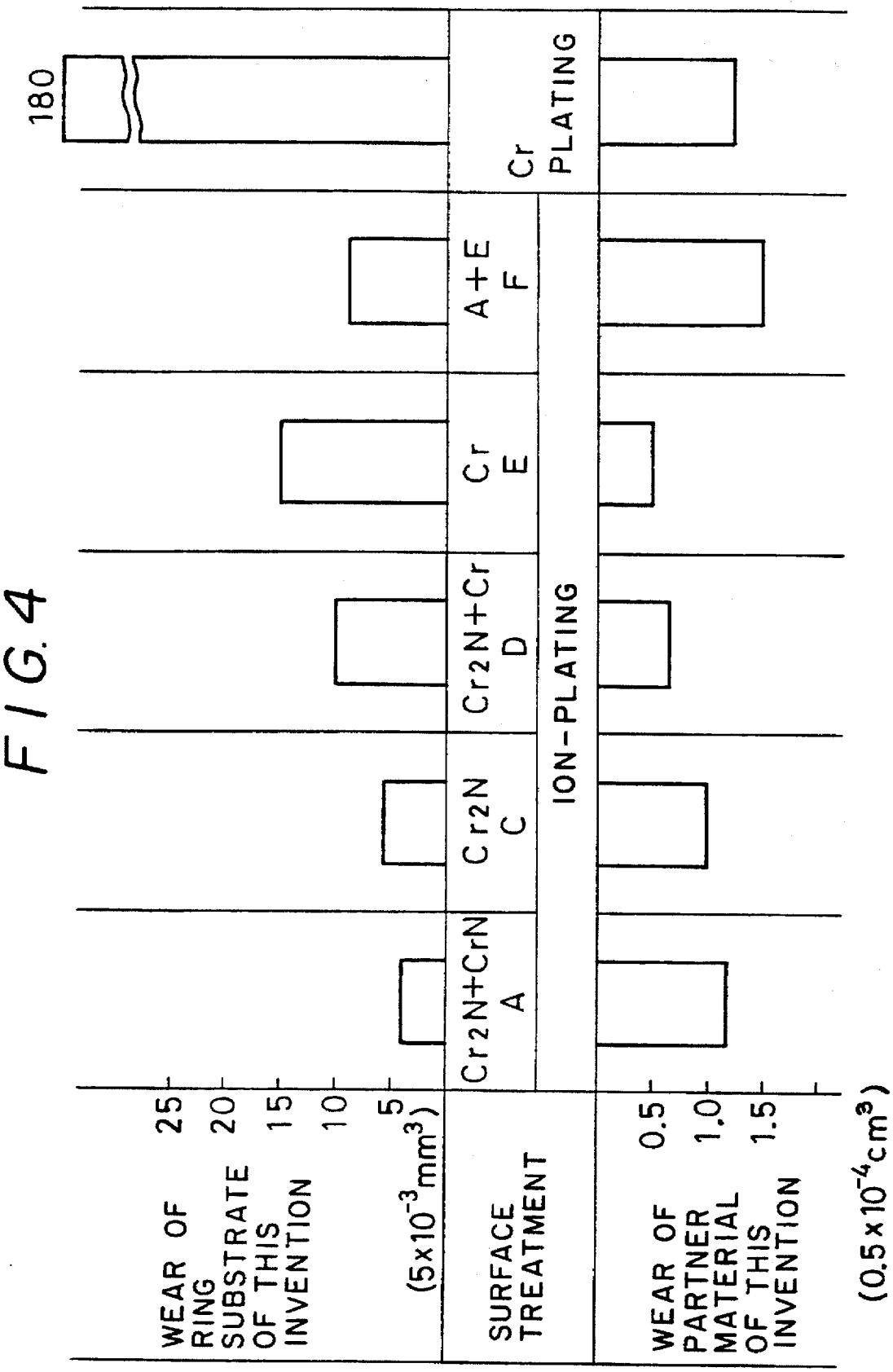

The results of wear tests of coatings produced by ion plating under various nitrogen partial pressures are shown in FIG. 4.

Figure 5:
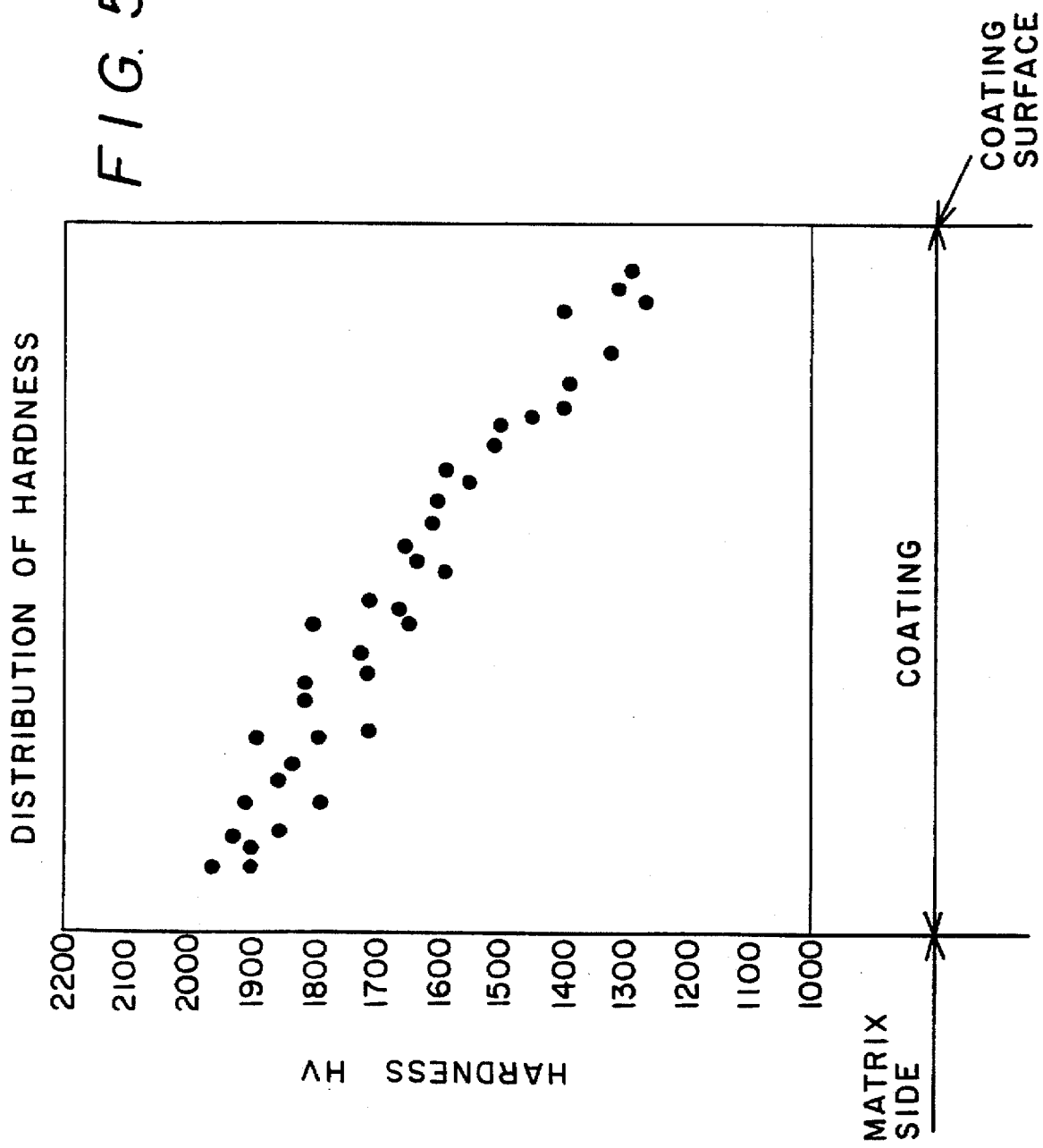

Distribution of the hardness in the coating of this invention is shown in FIG. 5.

DETAILED DESCRIPTION

The coating of this invention comprises soft chromium nitride or chromium in the outer surface, has good conformability and comprises hard chromium nitride having good wear resistance properties adjacent the surface of the substrate, after aging. When used with a piston ring, a sliding partner, e.g., a cylinder, is not damaged and the properties of the ceramic chromium nitride can be utilized. However, when the ceramic contacts a metal at the interface between the substrate and the coating, there is a possible problem of adherence of the coating. In such a case, chromium nitride having good wear resistance properties is not produced at the substrate boundary, but a layer of chromium not containing nitrogen is first formed on the substrate surface and, after that, a layer of chromium nitride is formed according to the present invention. Because the heat expansion coefficient of this chromium layer is nearly equal to that of the substrate, the chromium layer is hardly affected by heat stress and adheres strongly to the substrate. In addition, due to its softness, the coating can be used as the sliding surface of a sliding part under severe conditions.

This invention is concretely explained by the following examples.

Figure 1:
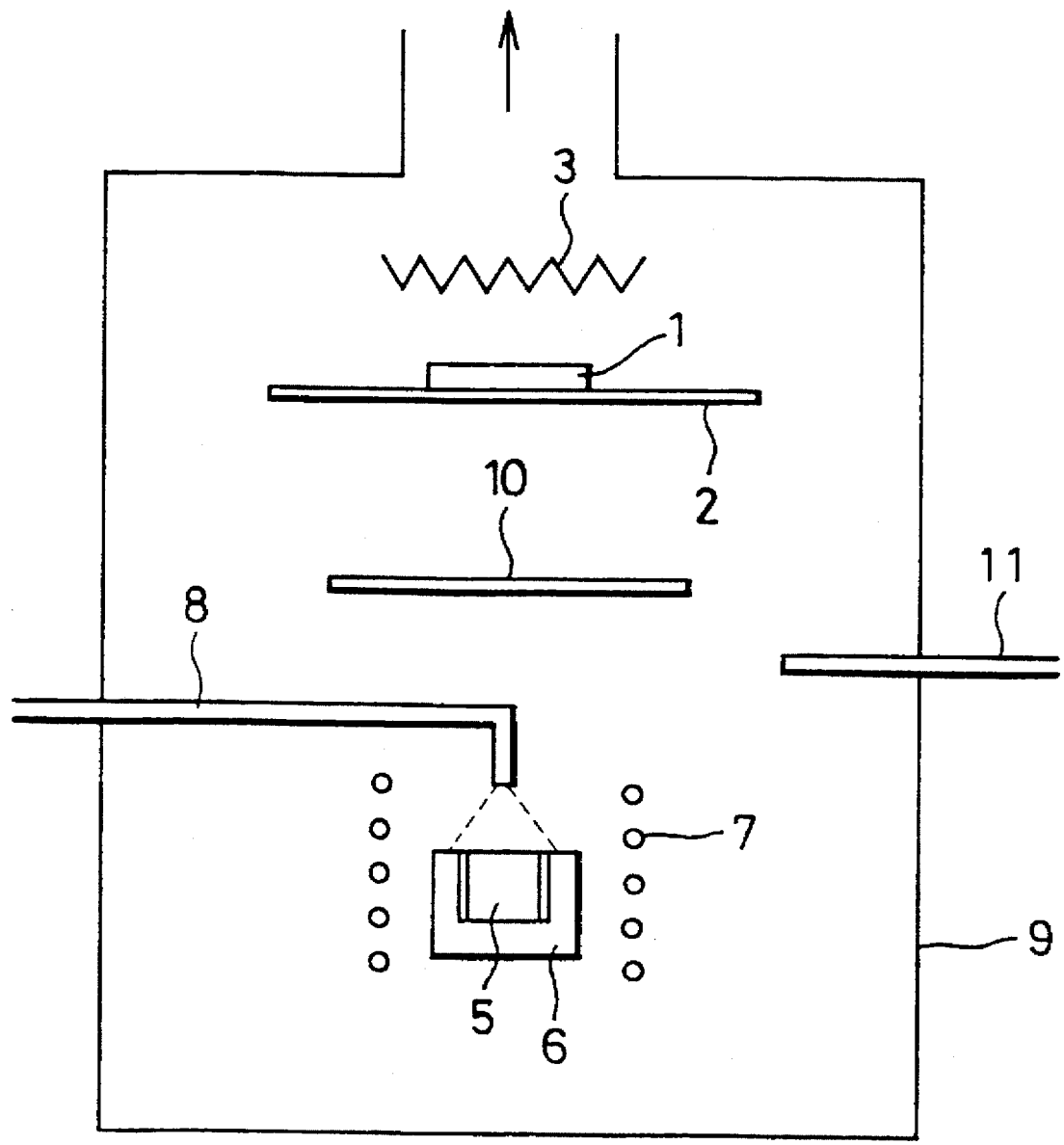

The ion-plating apparatus used is shown in FIG. 1. A substrate 1 held in a substrate holder 2 is heated with a heater 3 and the substrate 1 is held at a designated temperature with a heat regulator (not shown in the Fig.). A water cooled steel crucible 6, in which metal 5 is held as a vaporizing source, is placed below the substrate 1 in a vessel 9. A pipe 11 which introduces nitrogen gas into the vessel 9 and an electron gun 8 used to vaporize the metal 5 are positioned in a side wall in the vessel 9 and a focusing coil 7 is placed around the crucible 6 to direct the electrons from the electron gun 8 to the metal 5 to be vaporized. The pressure in the vessel 9 is reduced with a vacuum pump (not shown) and a shutter 10 is placed between the crucible 6 and the substrate holder 2. After providing an SUS 440C stainless steel plate 50×50×10 mm in size as the substrate in the apparatus and producing a vacuum in the vessel 9, argon gas is introduced into the vessel 9 from pipe 11 and the pressure of the vessel 9 is reduced to $1\times10^{-1}$ Torr. The surface of the substrate 1 is then cleaned by discharging electricity, using the substrate 1 as the cathode. Next the substrate is heated to 400° C. and the pressure of the vessel 9 is reduced to $5\times10^{-5}$ Torr. After that, the metal chromium 5 is vaporized by directing an electron beam to the metal chromium 5 placed in the crucible 6 from the electron gun 8. A partial pressure of nitrogen in the vessel 9 is brought to $2\times10^{-3}$ Torr by introducing nitrogen gas from the introducing pipe 11, and vapor-deposition is performed by opening the shutter 10. Such conditions are maintained for 2 minutes. The nitrogen gas is continuously reduced to $1\times10^{-4}$ Torr, in which the partial pressure of nitrogen is zero, over 20 minutes, and such partial pressure is maintained for 2 minutes and the shutter is closed. After that, the substrate 1, of which the vapor-deposition coating is formed on the surface, is removed from the vessel 9. The following test is then performed using the vapor-deposition coating thus formed.

(1) Analysis of the variation of the nitrogen and chromium content with an X-ray micro-analyzer.

To examine the average variation of the contents, or amounts, of chromium and nitrogen in the coating, a sample was cut in a perpendicular direction to the surface and a line analysis was performed to the inside from the surface (FIGS. 2 and 3). The content of chromium in the coating is lower in the inner portion contacted with the substrate and is higher approaching the surface. Also, the content of nitrogen in the coating is highest in the inner portion contacted with the substrate and is lower approaching the surface.

(2) Analysis of the outermost surface composition with X-ray diffraction.

It is judged that the outermost surface composition in the vapor deposition coating is $Cr+Cr_2N$ with the results of X-ray diffraction analysis and ASTM method.

(3) Analysis of the section composition with X-ray diffraction.

As mentioned above, the chemical composition of the coating of this invention is continuously changed toward the surface from the inside. It is expected, therefore, that the type of phase constituting the coating is naturally changed from the inside to the surface. To examine the phases constituting the coating, an analysis with X-ray diffraction was performed using a coating produced with a fixed partial nitrogen pressure in the range of 0.3 to $2.0\times10^{-3}$ Torr. (The conditions used, except for the nitrogen partial pressure, were the same as the test mentioned above.) The analytical results are shown in Table 1.

TABLE 1

| Sample | Partial Pressure of Nitrogen | Coating Makeup | Hardness of Coating Section |
|---|---|---|---|
| A | $2.0 \times 10^{-3}$ Torr | $CrN$, $Cr_2N$ | Hv 1895 |
| B | $1.5 \times 10^{-3}$ Torr | $CrN$, $Cr_2N$ | Hv 1832 |
| C | $1.0 \times 10^{-3}$ Torr | $Cr_2N$ | Hv 1722 |
| D | $0.7 \times 10^{-3}$ Torr | $Cr$, $Cr_2N$ | Hv 1507 |
| E | $0.3 \times 10^{-3}$ Torr | $Cr$ | Hv 1291 |

The coating of this invention was formed under conditions in which the partial pressure of nitrogen was initially $2\times10^{-3}$ Torr and was then gradually reduced. A vapor deposition layer comprising chromium nitride and chromium is formed on a vapor deposition layer only comprising chromium nitride. Further, only a chromium layer is formed thereon. It is concluded from the Table that the chromium concentration is continuously increased from the inside of the coating to the surface. This analysis agrees with the result of line analysis of an X-ray micro-analyzer mentioned above.

(4) Hardness analysis of a section of the coating.

The hardness of distribution of a section of the coating of this invention is shown in FIG. 5 and the hardness of the sections A to E of the coating in the above-mentioned example is shown in Table 1. It is judged that the hardness is gradually decreased from the substrate to the surface layer, and also it is judged that the hardness of the coating is continuously decreased from the inside to the surface and the coating becomes soft gradually, because the hardness roughly agrees with the hardness in the samples A to E shown in Table 1.

(5) Wear test.

A wear test was performed using sulfuric acid, pH 2.5, as a lubricant, and an FC-25 material (a cast iron having a tensile strength of 25 $kgf/cm^2$ according to JIS) as the partner cylinder under the conditions: load 2 kg, and friction velocity 0.2 m/sec, using a pin drum apparatus, in which the sample used in the above-mentioned X-ray diffraction analysis was used as a pin. For a comparative test, the same test was performed with a pin having hard chromium plating. The test results are shown in FIG. 4.

It may be understood that the coating of this invention has good wear resistance properties in portions away from the coating surface, when compared with the hard chromium plating layer. Also, when the partial pressure of nitrogen becomes low as with sample E, it is judged that the self-wear becomes large, as compared to samples A and C, but the amount of wear for the partner cylinder becomes low. The self-wear becomes less for samples A and C. However, the cylinder is worn away more as compared to E. Accordingly, when this invention is used for a piston ring and other sliding parts, it can be said that a coating is formed, in which a partner material is not damaged and after aging, the wear resistance property is maintained with a coating of A and C having less self-wear. However, when a coating, in which the composition is not gradually but, instead, is abruptly changed, is formed (for example, a layer E is suddenly formed on a layer A), the hardness variation becomes strong and wear of the partner is increased.

In a coating comprising chromium and nitrogen produced on a sliding substrate surface of a sliding part, or component, in this invention, the chromium concentration is gradually increased from the substrate surface in a perpendicular direction and the surface of the coating is formed of chromium. Then, a partner material is not worn away and the wear resistance property of the coating itself is good due to the hard nitride inside the coating. When used for a sliding part such as a piston ring, in which high capacity is required, a coating having good wear resistance and good initial conformability is obtained.

What is claimed is:

1. A method of providing a wear resistant coating on a surface of a substrate said method comprising vaporizing chromium in the presence of said substrate so as to form a layer of chromium on the surface of said substrate and thereafter reacting said vaporized chromium with nitrogen in the presence of said substrate and continuously decreasing a concentration of said nitrogen to form said wear-resistant coating on said layer of chromium on said substrate surface, wherein said coating is a composition of chromium and nitrogen which is chromium nitride adjacent said layer of chromium and which continuously increases in chromium content toward the surface of said coating.

* * * * *